United States Patent
Suzuki et al.

(10) Patent No.: US 8,115,365 B2
(45) Date of Patent: *Feb. 14, 2012

(54) SURFACE ACOUSTIC WAVE DEVICES

(75) Inventors: Kenji Suzuki, Nagoya (JP); Takashi Yoshino, Aichi-Pref. (JP)

(73) Assignee: NGK Insulators, Ltd., Nagoya (JP)

( * ) Notice: Subject to any disclaimer, the term of this patent is extended or adjusted under 35 U.S.C. 154(b) by 185 days.

This patent is subject to a terminal disclaimer.

(21) Appl. No.: 12/614,597

(22) Filed: Nov. 9, 2009

(65) Prior Publication Data

US 2010/0141086 A1    Jun. 10, 2010

Related U.S. Application Data

(63) Continuation-in-part of application No. 12/393,437, filed on Feb. 26, 2009.

(30) Foreign Application Priority Data

Apr. 15, 2008 (JP) ................ P2008-105407
Feb. 24, 2009 (JP) ................ P2009-40947
Oct. 14, 2009 (JP) ................ P2009-237621

(51) Int. Cl.
*H03H 9/25* (2006.01)
(52) U.S. Cl. ............. 310/313 R; 310/346; 333/193
(58) Field of Classification Search .......... 310/313 R, 310/346; 333/193
See application file for complete search history.

(56) References Cited

U.S. PATENT DOCUMENTS

| | | | |
|---|---|---|---|
| 4,978,879 A | 12/1990 | Satoh et al. | |
| 5,446,330 A | 8/1995 | Eda et al. | |
| 5,925,973 A * | 7/1999 | Eda et al. | 310/348 |
| 6,037,847 A | 3/2000 | Ueda et al. | |
| 7,105,980 B2 | 9/2006 | Abbott et al. | |
| 7,331,092 B2 | 2/2008 | Miura et al. | |
| 2001/0030795 A1* | 10/2001 | Fujii et al. | 359/285 |
| 2003/0199105 A1* | 10/2003 | Kub et al. | 438/3 |
| 2005/0062560 A1 | 3/2005 | Oshio | |
| 2006/0022768 A1 | 2/2006 | Yokota et al. | |
| 2007/0028667 A1* | 2/2007 | Kim et al. | 73/23.34 |
| 2007/0120623 A1 | 5/2007 | Sakiyama et al. | |
| 2007/0200459 A1 | 8/2007 | Yoshino et al. | |
| 2008/0169724 A1* | 7/2008 | Bhattacharjee et al. | 310/313 B |
| 2008/0218032 A1* | 9/2008 | Okamoto et al. | 310/358 |
| 2009/0081424 A1* | 3/2009 | Gomi | 428/195.1 |
| 2009/0256444 A1 | 10/2009 | Suzuki et al. | |

FOREIGN PATENT DOCUMENTS

| | | |
|---|---|---|
| DE | 100 01 192 | 7/2001 |
| JP | 2-37815 | 2/1990 |
| JP | 06-326553 A1 | 11/1994 |

(Continued)

OTHER PUBLICATIONS

Hirofumi Ide, "How-to: Strength of Materials: Basics," Nikkan Kogyo Shimbun, Ltd., pp. 43, 44, 36 and 37.

(Continued)

*Primary Examiner* — Thomas M Dougherty
(74) *Attorney, Agent, or Firm* — Burr & Brown

(57) ABSTRACT

A surface acoustic wave device has a supporting substrate, a propagation substrate made of a piezoelectric single crystal, an organic adhesive layer having a thickness of 0.1 to 1.0 μm and bonding the supporting substrate and the propagation substrate, and a surface acoustic wave filter provided on the propagation substrate.

13 Claims, 13 Drawing Sheets

FOREIGN PATENT DOCUMENTS

| | | |
|---|---|---|
| JP | 9-167936 | 6/1997 |
| JP | 2000-196410 | 7/2000 |
| JP | 2001-053579 A1 | 2/2001 |
| JP | 2002-135076 | 5/2002 |
| JP | 2005-65160 | 3/2005 |
| JP | 2005-229455 A1 | 8/2005 |
| JP | 2006-042008 A1 | 2/2006 |
| JP | 3774782 B2 | 5/2006 |
| JP | 2008-301066 | 12/2008 |
| JP | 2009-278610 | 11/2009 |

OTHER PUBLICATIONS

"*Science of Silicon*," USC Semiconductor Basic Technique Research Group, Jun. 28, 1996, pp. 989 and 991.

"*Handbook of Glass Optics*," Asakura shoten, Feb. 28, 1963, p. 792.

"*Cu electrode/Super wide range surface acoustic device using a rotation Y-cut X-propagation $LiNbO_3$ substrate structure*," Supersonic TECHNO, 2004, 5-6, pp. 98, 99 and 103.

\* cited by examiner (a)

(b)

(c)

(d)

(a)

(b)

(a)

(b)

Thickness of piezoelectric substrate
(36° Y-LT)    30 μ m
Thickness of supporting substrate (Si)   200 μ m
Thickness of Al electrode    0.14 μ m (Electrode thickness t/ wavelength λ of surface acoustic wave)
= 7 %

Thickness of piezoelectric substrate
(47° Y-LT)   30 μm
Thickness of supporting substrate (Si)   350 μm
Thickness of Al electrode   0.14 μm (Electrode thickness t/ wavelength λ of surface acoustic wave)
= 7 %

Thickness of piezoelectric substrate
(47° Y-LT)     30 μ m
Thickness of supporting substrate (Si)   350 μ m
Thickness of Al electrode Al alloy (Al-1%Cu)

(Electrode thickness t/ wavelength λ of surface acoustic wave)
= 7 %

Thickness of piezoelectric substrate
(47° Y-LT)    30 μm
Thickness of supporting substrate (Si)   350 μm
Thickness of Al electrode    0.06 μm (Electrode thickness t/ wavelength λ of surface acoustic wave)
= 3 %

Thickness of piezoelectric substrate
(47° Y-LT)     30 μm
Thickness of supporting substrate (Si)   350 μm
Thickness of Al electrode    0.3 μm (Electrode thickness t/ wavelength $\lambda$ of surface acoustic wave)
= 15 %

Thickness of piezoelectric substrate
(36° Y-LT)   10 μm
Thickness of supporting substrate (Si)   500 μm
Thickness of Al electrode   0.14 μm (Electrode thickness t/ wavelength λ of surface acoustic wave)
= 7 %

Thickness of piezoelectric substrate
(36° Y-LT)    25 μm
Thickness of supporting substrate (Si)   150 μm
Thickness of Al electrode    0.14 μm (Electrode thickness t/ wavelength λ of surface acoustic wave)
= 7 %

Thickness of piezoelectric substrate
(36° Y-LT)    40 μ m
Thickness of supporting substrate (Si)   300 μ m
Thickness of Al electrode   0.14 μ m (Electrode thickness t/ wavelength $\lambda$ of surface acoustic wave)
= 7 %

SURFACE ACOUSTIC WAVE DEVICES

FIELD OF THE INVENTION

The present invention relates to a surface acoustic wave device with superior temperature characteristics of frequency.

BACKGROUND OF THE INVENTION

Surface acoustic wave (SAW) devices have been in extensive use as bandpass filters in communication equipments such as a cellular phone and the like. With the enhancement of the performance of cellular phone and the like, there is an increasing demand to enhance the performance of the filters using the surface acoustic wave devices.

In the surface acoustic wave device, however, there is a problem of the passband shifts due to temperature changes. In particular, lithium niobate and lithium tantalate frequently used have high electromechanical coupling coefficients, and thus provide an advantage in achieving broad-band filtering characteristics. However, lithium niobate and lithium tantalite are of inferior temperature stability.

For example, in lithium tantalate, the temperature coefficient of frequency change is −35 ppm/° C. and the frequency varies greatly in the temperature range of −30° C. to +85° C. Therefore, it is necessary to lower the temperature coefficient of the frequency change.

Patent Document 1 (Japanese Patent Publication No. 2001-53579A) describes a device fabricated by bonding a SAW propagation substrate and a supporting substrate together with an organic thin film layer. The propagation substrate is a 30-μm-thick lithium tantalate substrate, for example, and is bonded to a 300-μm-thick glass substrate with a 15-μm-thick organic adhesive.

Patent document 2 (Japanese Patent Publication No. 2006-42008A) describes a SAW device fabricated by laminating a lithium tantalate substrate (125 μm in thickness) and a quartz glass substrate (125 μm in thickness) together with an adhesive. Specifically, according to (0030), an adhesive layer is required because the direct bonding of the supporting substrate and the propagating substrate results in the peeling and cracks.

Patent document 3 (Japanese Patent Publication No. Hei 06-326553A), Patent Document 4 (Japanese Patent No. 3774782B) and Patent document 5 (U.S. Pat. No. 7,105,980B) also describe SAW devices fabricated by bonding a SAW propagation substrate and a supporting substrate together.

Further, according to Patent Document 6 (Japanese Patent Publication No. 2005-229455A), oxidized layers of a thickness of 0.1 to 40 μm are formed on both main faces of a silicon supporting substrate, and a piezoelectric substrate is then bonded to the supporting substrate to produce a SAW device. The oxidized layer of silicon is indispensable for reducing the warping of the thus obtained composite piezoelectric substrate 1.

According to the description of (0007) and (0013) of Patent Document 7 (Japanese Patent publication No. 2002-135076A), the surface roughness of the substrate is 10 μm and it is difficult to make the thickness of an adhesive layer constant.

According to (0018) of Patent Document 8 (Japanese Patent Publication No. H09-167936A), even when the rotation angle θ, cutting angle, of a propagation substrate is varied, it is shown substantially same temperature characteristics for the cases of, for example, 36° Y, 40° Y, 42° Y and 44° Y.

According to FIG. 6 of Patent document 9 (Japanese Patent publication No. H02-37815A, it is shown dependency of temperature characteristics on the electrode thickness. According to the description, the electrode thickness does not influence on the temperature dependency of frequency.

According to FIG. 4 of Patent document 10 (Japanese Patent Publication No. 2005-65160A), it is used quartz substrates having Euler angles of 0°, 127° and 90° to show the relationship between standardized electrode thickness H/λ and TCF (frequency temperature coefficient) at 25° C.

The thermal expansion coefficient and Young's modulus of lithium tantatate are described in (0021) of Patent document 11 (Japanese Patent Publication No. 2008-301066A).

Pages 43, 44, 36 and 37 of Non-Patent Document 1 "How-to; Strength of Materials: Basics" (authored by Hirofumi IDE and published by THE NIKKAN KOGYO SHIMBUN, LTD.) describe the relationship of thermal expansion coefficient and Young's Modulus of a bonding material.

Pages 989 and 991 of Non-Patent Document 2 "Science of Silicon" (edited by USC Semiconductor Basic Technique Research Group and published on Jun. 28, 1996) describes the thermal expansion coefficient and Young's Modulus of silicon.

Non-Patent document 3 "Handbook of Glass Optics" (published by Asakura shoten on Feb. 28, 1963, page 792) describes data of borosilicate glass.

Patent document 12 (Japanese Patent Application No. 2009-40947: Japanese Patent publication No. 2009-278610A) relates to the present patent application.

RELATED TECHNICAL DOCUMENTS

Non-Patent Documents (Non-Patent Document 1)
Pages 43, 44, 36 and 37 of "How-to; Strength of Materials; Basics" authored by Hirofumi IDE and published by THE NIKKAN KOGYO SHIMBUN, LTD.
(Non-Patent Document 2)
Pages 989 and 991 of "Science of Silicon" edited by USC Semiconductor Basic Technique Research Group and published on Jun. 28, 1996
(Non-Patent Document 3)
"Handbook of Glass Optics" published by Asakura shoten on Feb. 28, 1963, page 792

Patent Documents (Patent Document 1) Japanese Patent Publication No. 2001-53579A
(Patent document 2) Japanese Patent Publication No. 2006-42008A
(Patent document 3) Japanese Patent Publication No. Hei 06-326553A
(Patent Document 4) Japanese Patent No. 3774782B
(Patent document 5) U.S. Pat. No. 7,105,980B
(Patent Document 6) Japanese Patent Publication No. 2005-229455A
(Patent Document 7) Japanese Patent publication No. 2002-135076A
(Patent Document 8) Japanese Patent Publication No. H09-167936A (Patent document 9) Japanese Patent publication No. H02-37815A (Patent document 10) Japanese Patent Publication No. 2005-65160A
(Patent document 11) Patent Publication 2008-301066A
(Patent document 12) Japanese Patent Application No. 2009-40947 (Japanese Patent publication No. 2009-278610A)

SUMMARY OF THE INVENTION

In any of the aforementioned references, however, the problem of the shift of the passband due to temperature changes is not solved. If anything, they are moving away from the solution.

In paragraphs (0025) and (0037) of the Patent document 1, there is a description of the temperature coefficient of frequency of the SAW device fabricated by bonding the lithium tantalate substrate to the supporting substrate. The temperature characteristics of the device are hardly improved compared with those of SAW devices fabricated in a lithium tantalite substrate only. For example, in the case of a 2-GHz SAW filter, a passband shift of ±4 MHz is observed in a temperature range of minus 30 to plus 85° C. This corresponds to ±7% of the necessary bandwidth. Therefore, it is proved that the provision of the adhesive layer between the lithium tantalate propagation substrate and the glass supporting substrate hardly improves the temperature characteristics of frequency.

TABLE 1

|  | propagation substrate/ adhesive layer/ glass substrate | Propagation substrate (bottom surface roughened/ adhesive layer/ glass substrate |
| --- | --- | --- |
| Lithium tantalite 36° Y substrate Temperature Coefficient of frequency (ppm/° C.) | −28 | −30 |

Although paragraph (0037) of the Patent document 2 includes the description that "it also becomes possible to improve the temperature characteristics of frequency of the surface acoustic wave device", no data on the improvement is presented.

In paragraph (0062) of the Patent document 3 as well, a clear description is given that it is impossible to make practical use of a method of bonding a surface acoustic wave propagation substrate to a supporting substrate.

Judging from the above, it is common knowledge that it is impossible to make practical use of surface acoustic wave substrates having, for example, a structure in which a lithium tantalate propagation substrate is bonded to a supporting substrate and that it is particularly impossible to lower the temperature coefficient of frequency.

Further, according to the Patent document 6, it is required to hold the Si substrate for several tens of hours while flowing oxygen gas under a high temperature of, for example, 1000° C. to form a surface oxidized film. According to this process, however, in addition to the surface oxidation of the Si substrate, Si atoms themselves are dissolved into the thus formed $SiO_2$ layer. This results in a defect layer of Si along the interface between the Si and $SiO_2$ layer that reduces the adhesive strength along the interface. Moreover, the thickness of the adhesive layer between the Si supporting substrate and the piezoelectric substrate is 3 μm in all the examples. In addition to this, it is described that if the thickness of the adhesive layer would have been less than 1.5 μm, the adhesive strength would be insufficient to result in the peeling at 250° C. (0028).

An object of the present invention is to lower the temperature coefficient of frequency of a surface acoustic wave device including a piezoelectric single crystal propagation substrate.

The present invention provides a surface acoustic wave device comprising:
a supporting substrate;
a propagation substrate comprising a piezoelectric single crystal;
an organic adhesive layer having a thickness of 0.1 to 1.0 μm bonding the supporting substrate and the propagation substrate; and
a surface acoustic wave filter or resonator provided on the propagation substrate.

Contrary to the common knowledge of those skilled in the art, the present inventors have continued the study of structure in which a propagation substrate of a piezoelectric single crystal, for example, a lithium tantalate single crystal, is bonded to a supporting substrate. Then, they attempted thinning the organic adhesive layer, which is an approach that had been previously overlooked. The significance of such an attempt had been denied in (see, for example, paragraph (0062) of Patent document 3).

However, contrary to expectations, it has been found that the propagation substrate is firmly bonded to the supporting substrate and the temperature coefficient of frequency is considerably low. That is, in the case where the thickness of the organic adhesive layer was from 0.1 to 1.0 μm, temperature characteristics brought about by the difference in thermal expansion coefficients between the propagation and supporting substrates were considerably improved. In contrast, in the case where the thickness of the adhesive layer was over 1 μm, a stress resulting from the differences in thermal expansion coefficient between the propagation and supporting substrates was absorbed by the organic adhesive, and therefore the effect of improving the temperature characteristics could not be secured, if anything. Further, in the case where the thickness of the adhesive layer is below 0.1 μm, it seems that the temperature characteristics of frequency are deteriorated again due to the influence of voids, and thus it has been confirmed that even if the adhesive layer is thinned as much as possible, the temperature characteristics are not necessarily improved.

DETAILED DESCRIPTION OF THE INVENTION

The surface acoustic wave device according to the present invention includes a surface acoustic wave filter or a resonator. The surface acoustic wave filter is a bandpass filter as described later. The resonator is a surface acoustic wave oscillator element, and includes one-port and two-port types.

In this invention, materials for a supporting substrate are preferably selected from the group consisting of silicon, sapphire, aluminum nitride, alumina, borosilicate glass and quartz glass. Preferably, the supporting substrate is made of silicon or borosilicate glass, and most preferably silicon. The use of these materials makes it possible to reduce the difference in thermal expansion with a propagation substrate and further improve the temperature characteristics of frequency.

Preferably, an oxide film is not formed on the surface of the supporting substrate. It is thus possible to improve the adhesive strength of the supporting and propagation substrates and to prevent the peeling or cracks of the supporting and propagation substrates even at a high temperature. On the viewpoint, the supporting substrate may preferably be made of silicon without a silicon oxide film on the surface. The presence and absence of the surface oxide film can be observed using a TEM (transmission electron Microscope) at the cross section.

Furthermore, according to the invention, materials for the propagation substrate are preferably selected from the group consisting of lithium niobate, lithium tantalate and lithium niobate-lithium tantalate solid solution single crystals having high electromechanical coupling coefficients. Preferably, the piezoelectric single crystal is lithium tantalate.

Further, preferably, the direction of propagation of surface acoustic wave in the propagating substrate is X direction and the cutting angle is rotation Y plate. More preferably, the propagating substrate is 36 to 47° rotational Y cut plate.

Materials for the organic adhesive layer for bonding the supporting substrate and the propagation substrate are preferably, but not limited to, an acrylic resin or an epoxy resin.

According to the invention, a thickness "t" of the organic adhesive layer is set at 0.1 to 1.0 μm; in terms of the further improvement of the temperature characteristics of frequency of the surface acoustic wave device, the thickness of the organic adhesive layer is preferably 0.1 μm or more, or 0.8 μm or less.

Figure 1:
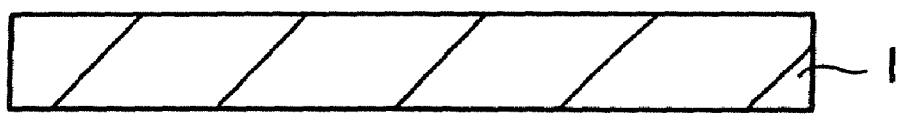
FIGS. 1(a), 1(b), 1(c), and 1(d), are schematic cross-sectional views of a laminated body for a surface acoustic wave device made in the order of the manufacturing process.
Figure 1:
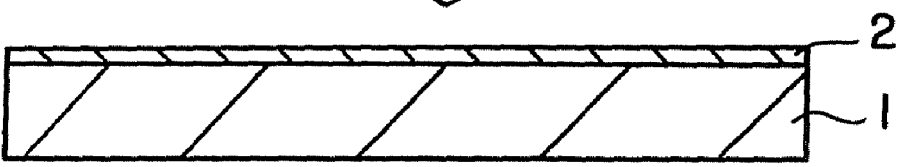
Figure 1:
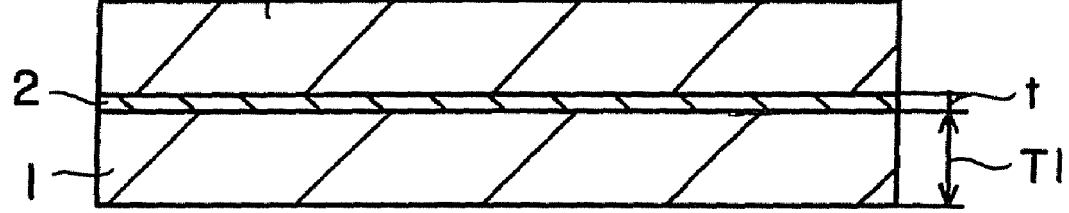
Figure 1:
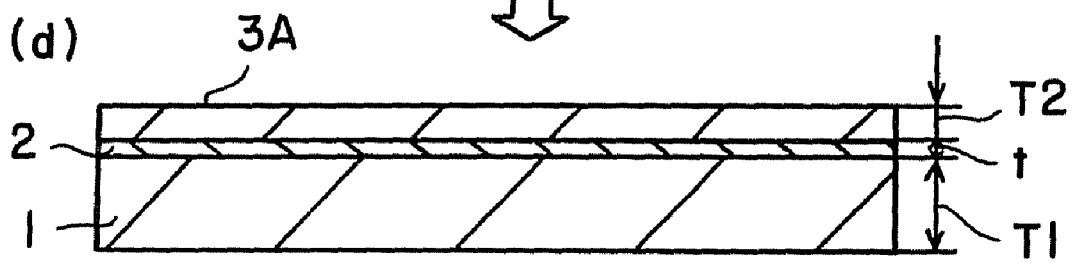

FIG. 1 is schematic cross-sectional view of a laminated body for the surface acoustic wave device made in the order of the manufacturing process.

As shown in FIG. 1(a), a supporting substrate 1 is prepared. As shown in FIG. 1(b), an organic adhesive 2 is applied onto a surface of the supporting substrate 1 and as shown in FIG. 1(c), a substrate 3 of a piezoelectric single crystal is bonded to the adhesive layer 2. Then, as illustrated in FIG. 1(d), the substrate 3 is worked into a thin plate, i.e., a propagation substrate 3A having a thickness T2.

Thereafter, as shown in FIGS. 2(a) and 2(b), input electrodes 4 and output electrodes 5 are formed on the propagation substrate 3A to obtain a transversal surface acoustic wave device 6. Surface acoustic waves are propagated from the input electrodes 4 to the output electrodes 5 as indicated by arrow 7. The portion where the propagation is made functions as a surface acoustic wave filter.

With surface acoustic wave filters for cellular phones, resonant type surface acoustic devices are mainly used. FIGS. 3(a) and 3(b) show one example of such devices. FIG. 3(a) is a plan view of the electrode pattern of the surface acoustic wave device, and FIG. 3(b) is a cross-sectional view taken along line A-A' in FIG. 3(a).

Electrodes 16, 17, and 18 are formed on a propagation substrate 10 to obtain a resonant surface acoustic wave device. In this example, the propagation substrate 10 is bonded to a supporting substrate 12 via an organic adhesive layer 14. The supporting substrate 12, the adhesive layer 14, and the propagation substrate 10 are formed according to the present invention as described above.

The method for forming the organic adhesive layer is not limited; the utilization of printing and spin coating can be exemplified.

Materials for forming the surface acoustic wave filter and resonator include aluminum, aluminum alloy, copper and gold, and may preferably be aluminum or aluminum alloy. Such aluminum alloy may have a composition of 0.3 to 5 weight percents of Cu added to Al. In the alloy, Ti, Mg, Ni, Mo or Ta may be used instead of Cu.

The ratio (t/λ) of the thickness "t" of the surface acoustic wave filter or resonator with the wavelength "λ" of the surface acoustic wave filter may preferably be 3 to 15 percent and more preferably be 5 percent and more and 15 percent or less.

The thickness T1 of the supporting substrate 1 is preferably not less than 100 μm, more preferably not less than 150 μm, and most preferably not less than 200 μm, from the viewpoint of the improvement of the temperature characteristics. Further, from the viewpoint of the miniaturization of products, the thickness T1 is preferably not more than 500 μm.

The thickness T2 of the propagation substrate 3A is preferably 10 to 50 μm, more preferably 10 to 40 μm, and most preferably be 10 to 30 μm, from the viewpoint of the improvement of the temperature characteristics of frequency.

EXAMPLES

Example 1

Figure 2:
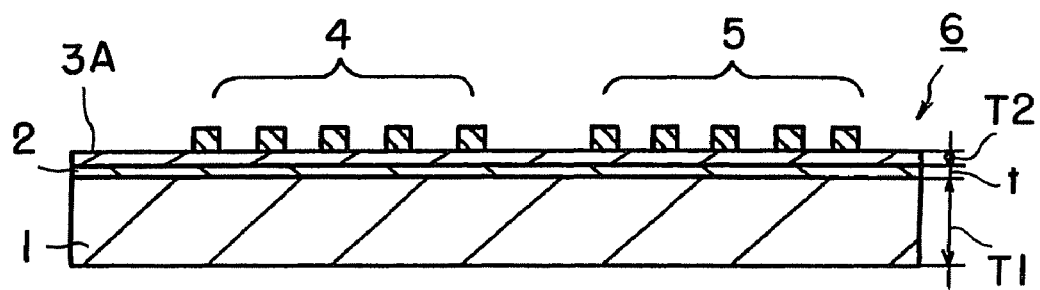
FIG. 2(a) is a schematic cross-sectional view of a surface acoustic wave device 6.
FIG. 2(b) is a schematic plan view of the surface acoustic wave device 6.
Figure 2:
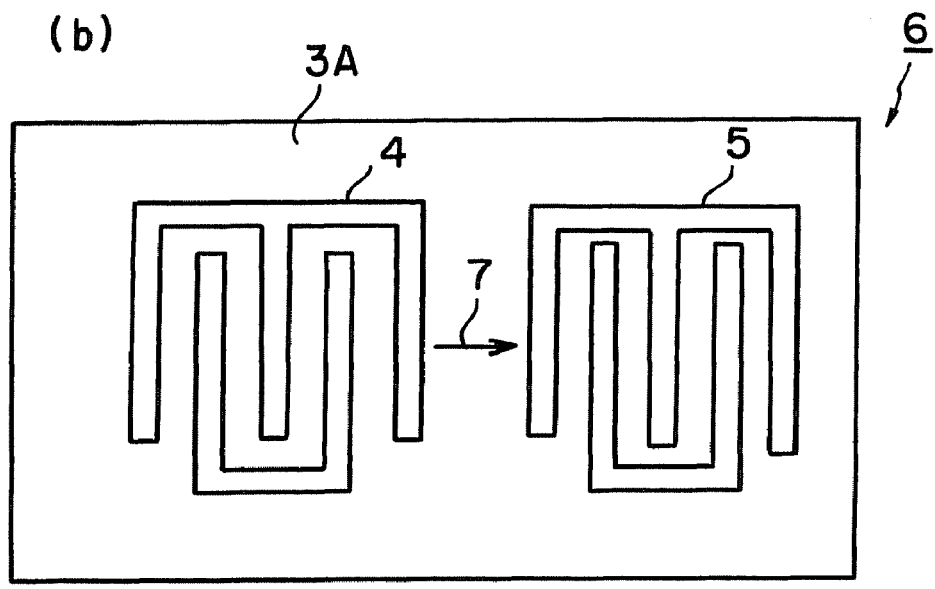

The surface acoustic wave device 6 of FIG. 2 was made using the manufacturing method shown in FIG. 1.

It should be noted that, as the substrate 3 was used a 36° Y-cut, X-propagation lithium tantalate substrate which had been cut out at an angle determined so as to form the rotated Y-cut plate and in which the direction of SAW propagation was set at the direction of the X-axis. The linear expansion coefficient in the SAW propagation direction X was 16 ppm/°C. As the supporting substrate 1, a single crystal silicon substrate was used. The linear expansion coefficient in the SAW propagation direction X of the supporting substrate 1 was 3 ppm/° C. The supporting substrate 1 was formed with a thickness T1 of 350 μm, the piezoelectric single crystal substrate 3 was formed with a thickness of 350 μm, and both the substrates were bonded together with the organic (acrylic) adhesive at 180° C. Then, the thickness of the piezoelectric single crystal substrate 3 was reduced to 30 μm by lapping and polishing. On the resulting propagation substrate 3A, the input electrodes 4 and output electrodes 5 of metallic aluminum were formed. (Thickness "t" of electrode)/(wavelength "λ" of surface acoustic wave) is 7 percent.

Figure 4:
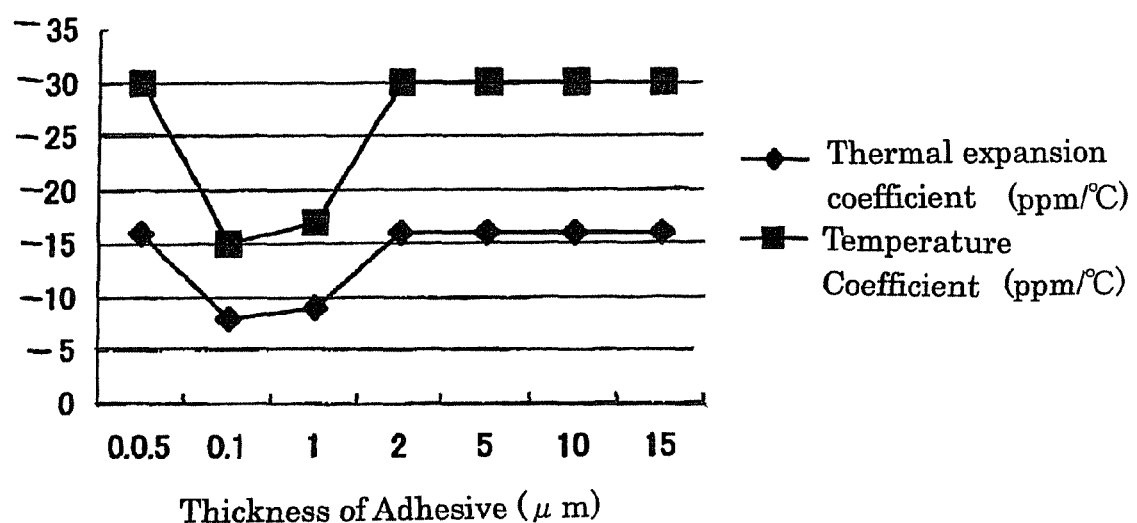
FIG. 4 is a graph showing the relationship between thickness of adhesive layers, thermal expansion coefficients, and the temperature characteristics of frequency.

The thickness "t" of the organic adhesive layer 2 was changed variously within the range of 0.05 to 15 μm. Then, the thermal expansion coefficient of each surface acoustic wave device and the temperature coefficient of frequency at the resonance point were measured; the results of the measurement are presented in Table 2 and FIG. 4.

TABLE 2

|  | Thickness t of organic adhesive layer (μm) | | | | | | |
| --- | --- | --- | --- | --- | --- | --- | --- |
|  | 0.05 | 0.1 | 1 | 2 | 5 | 10 | 15 |
| Thermal Expansion coefficient (ppm/° C.) | 16 | 8 | 9 | 16 | 16 | 16 | 16 |
| Temperature characteristics (ppm/° C.) | −30 | −15 | −17 | −30 | −30 | −30 | −30 |

From these results, it can be seen that by setting the thickness of the organic adhesive layer to 0.1 to 1.0 μm, the temperature coefficient of frequency is considerably and critically improved.

Example 2

Figure 3:
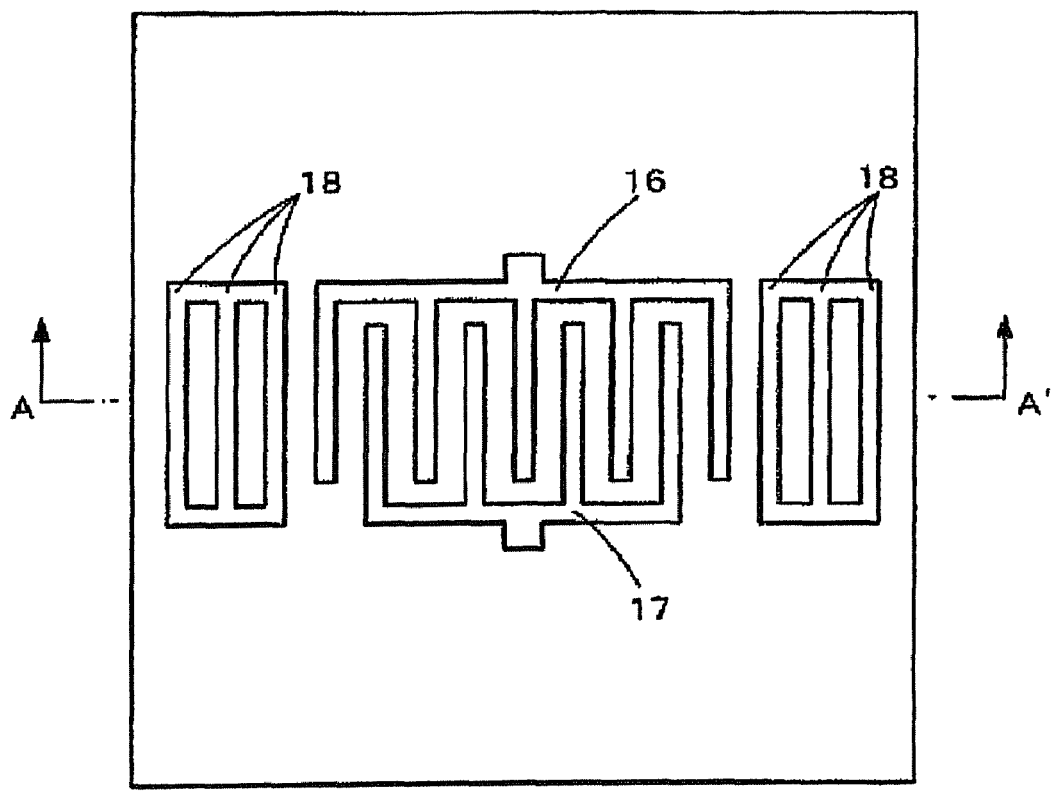
FIG. 3(a) is a plan view of a surface acoustic wave device with a resonator.
FIG. 3(b) is a cross-sectional view taken along line A-A' in FIG. 3(a).
Figure 3:
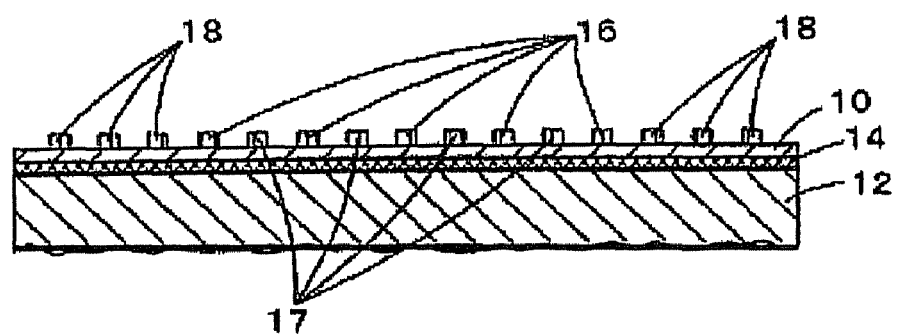

Next, the surface acoustic wave device of FIG. 3 was made according to the same procedure as the Example 1. The thus obtained device was subjected to the same experiment as the Example 1 to prove that the temperature coefficient of frequency is considerably and critically improved by setting the thickness of the organic adhesive layer to 0.1 to 1.0 μm.

Example 3

The surface acoustic wave device of FIG. 3 was made using the manufacturing method shown in FIG. 1.

It is noted that, as the propagation substrate 10 was used a 36° Y-cut, X-propagation lithium tantalate substrate which had been cut out at an angle determined so as to form the rotated Y-cut plate and in which the direction of SAW propagation was set at the direction of the X-axis. The supporting substrate 12 is made of silicon single crystal. The thickness "T1" of the supporting substrate 12 was 200 μm. The thickness of the propagation substrate 10 was 30 μm. The electrodes 16, 17 and 18 made of aluminum and having a thickness of 0.14 μm was formed on the propagation substrate 10. (Thickness "t" of electrode)/(wavelength "λ" of surface acoustic wave) is 7 percent.

Figure 5:
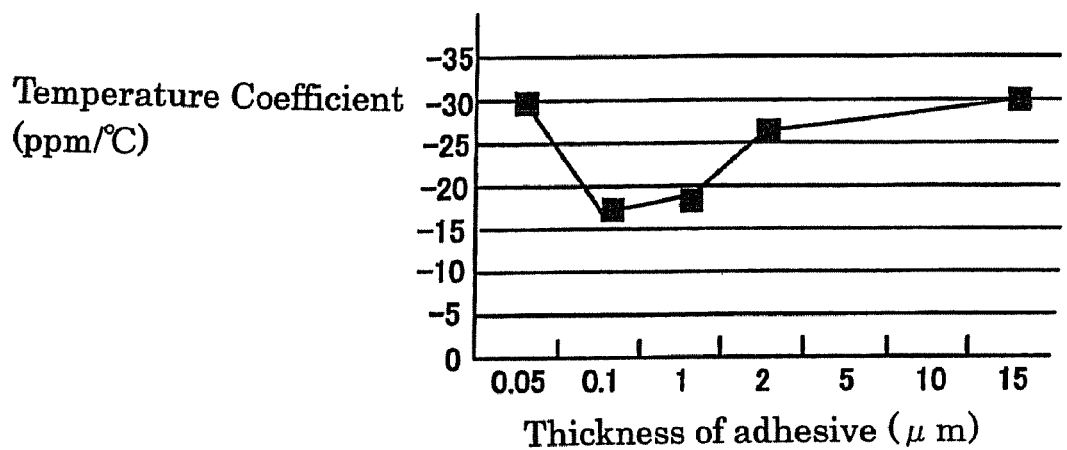
FIG. 5 is a graph showing the relationship of the thickness of an adhesive layer and the temperature characteristic of frequency.

The thickness "t" of the organic adhesive layer 2 was variously changed in a range of 0.05 to 15 μm. The temperature coefficient of frequency at the resonance point of the surface acoustic device was measured for each device and the results were shown in FIG. 5 and table 3.

TABLE 3

|  | Thickness t of organic adhesive layer (μm) | | | |
| --- | --- | --- | --- | --- |
|  | 0.05 | 0.1 | 1 | 15 |
| Temperature coefficient of Frequency (ppm/° C.) | −30 | −17 | −18 | −30 |

Example 4

The surface acoustic wave device of FIG. 3 was made using the manufacturing method shown in FIG. 1.

It is noted that, as the propagation substrate 10 was used a 47° Y-cut, X-propagation lithium tantalate substrate which had been cut out at an angle determined so as to form the rotated Y-cut plate and in which the direction of SAW propagation was set at the direction of the X-axis. The supporting substrate 12 was made of silicon single crystal. The thickness "T1" of the supporting substrate 12 was 350 μm and the thickness of the propagation substrate 10 was 30 μm. The electrodes 16, 17 and 18 made of aluminium and having a thickness of 0.14 μm was then formed on the thus obtained propagation substrate 10. (Thickness "t" of electrode)/(wavelength "λ" of surface acoustic wave) is 7 percent.

Figure 6:
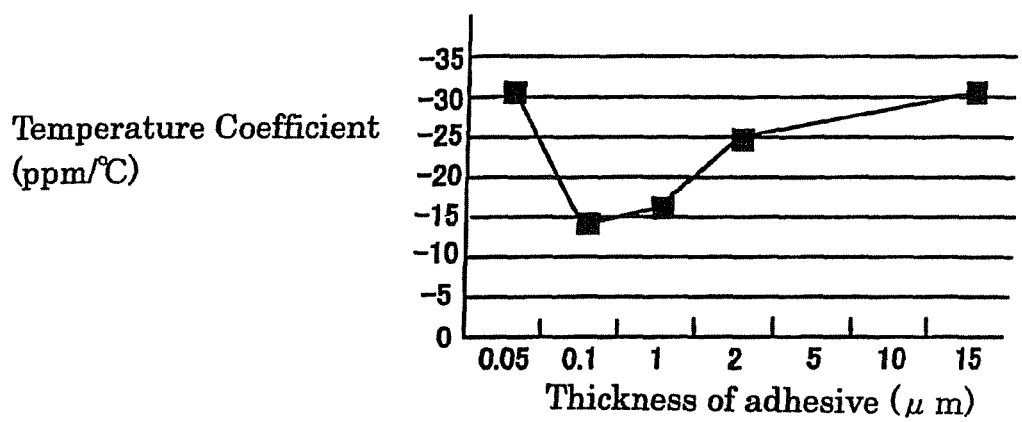
FIG. 6 is a graph showing the relationship of the thickness of an adhesive layer and the temperature characteristic of frequency.

The thickness "t" of the organic adhesive layer 2 was variously changed in a range of 0.05 to 15 μm. The temperature coefficient of frequency at the resonance point of the surface acoustic device was measured for each device and the results were shown in FIG. 6 and table 4.

TABLE 4

|  | Thickness t of organic adhesive layer (μm) | | | |
| --- | --- | --- | --- | --- |
|  | 0.05 | 0.1 | 1 | 15 |
| Temperature Coefficient of Frequency (ppm/° C.) | −31 | −14 | −16 | −31 |

Example 5

The surface acoustic wave device of FIG. 3 was made using the manufacturing method shown in FIG. 1.

It is noted that, as the propagation substrate 10 was used a 47° Y-cut, X-propagation lithium tantalate substrate which had been cut out at an angle determined so as to form the rotated Y-cut plate and in which the direction of SAW propagation was set at the direction of the X-axis. The supporting substrate 12 was made of silicon single crystal. The thickness "T1" of the supporting substrate 12 was 350 μm and the thickness of the propagation substrate 10 was 30 μm. The electrodes 16, 17 and 18 made of aluminum alloy (Al-1% Cu) and having a thickness of 0.14 μm was then formed on the thus obtained propagation substrate 10. (Thickness "t" of electrode)/(wavelength "λ" of surface acoustic wave) is 7 percent.

Figure 7:
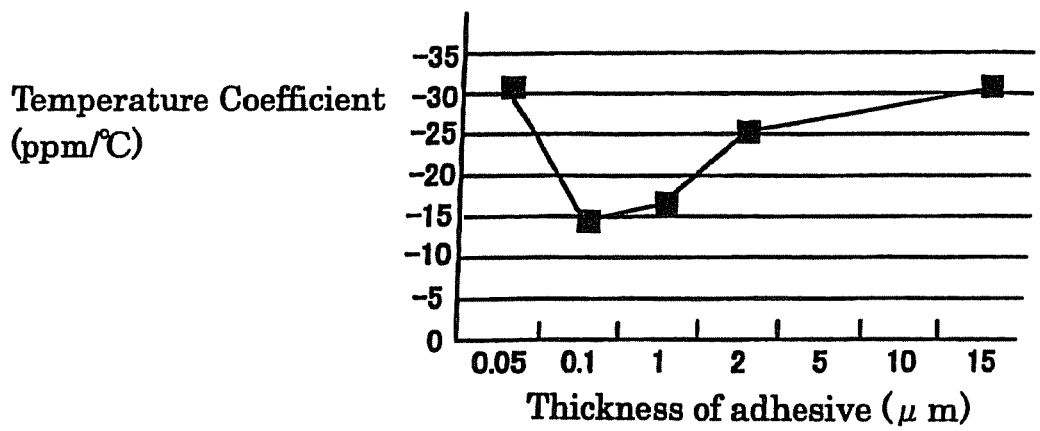
FIG. 7 is a graph showing the relationship of the thickness of an adhesive layer and the temperature characteristic of frequency.

The thickness "t" of the organic adhesive layer 2 was variously changed in a range of 0.05 to 15 μm. The temperature coefficient of frequency at the resonance point of the surface acoustic device was measured for each device and the results were shown in FIG. 7 and table 5.

TABLE 5

| | Thickness t of organic adhesive layer (μm) | | | |
| --- | --- | --- | --- | --- |
| | 0.05 | 0.1 | 1 | 15 |
| Temperature coefficient of Frequency (ppm/° C.) | −31 | −14 | −17 | −31 |

Example 6

The surface acoustic wave device of FIG. 3 was made using the manufacturing method shown in FIG. 1.

It is noted that, as the propagation substrate 10 was used a 47° Y-cut, X-propagation lithium tantalate substrate which had been cut out at an angle determined so as to form the rotated Y-cut plate and in which the direction of SAW propagation was set at the direction of the X-axis. The supporting substrate 12 was made of silicon single crystal. The thickness "T1" of the supporting substrate was 350 μm and the thickness of the propagation substrate 10 was 30 μm. The electrodes 16, 17 and 18 made of aluminum and having a thickness of 0.06 μm was then formed on the thus obtained propagation substrate 10. (Thickness "t" of electrode)/(wavelength "λ" of surface acoustic wave) is 3 percent.

Figure 8:
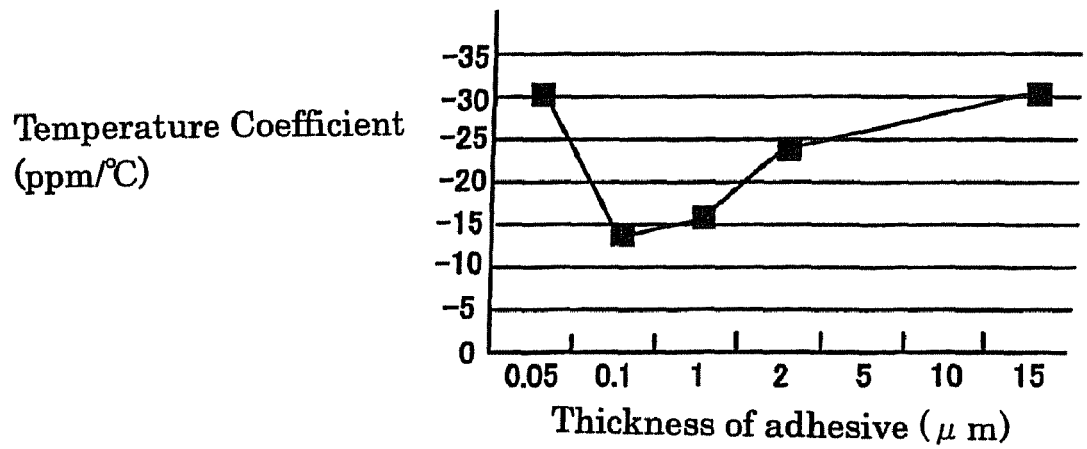
FIG. 8 is a graph showing the relationship of the thickness of an adhesive layer and the temperature characteristic of frequency.

The thickness "t" of the organic adhesive layer 2 was variously changed in a range of 0.05 to 15 μm. The temperature coefficient of frequency at the resonance point of the surface acoustic device was measured for each device and the results were shown in FIG. 8 and table 6.

TABLE 6

| | Thickness t of Organic adhesive layer (μm) | | | |
| --- | --- | --- | --- | --- |
| | 0.05 | 0.1 | 1 | 15 |
| Temperature coefficient of Frequency (ppm/° C.) | −30 | −13 | −16 | −30 |

Example 7

The surface acoustic wave device of FIG. 3 was made using the manufacturing method shown in FIG. 1.

It is noted that, as the propagation substrate 10 was used a 47° Y-cut, X-propagation lithium tantalate substrate which had been cut out at an angle determined so as to form the rotated Y-cut plate and in which the direction of SAW propagation was set at the direction of the X-axis. The supporting substrate 12 was made of silicon single crystal. The thickness "T1" of the supporting substrate was 350 μm and the thickness of the propagation substrate 10 was 30 μm. The electrodes 16, 17 and 18 made of aluminum and having a thickness of 0.3 μm was then formed on the thus obtained propagation substrate 10. (Thickness "t" of electrode)/(wavelength "λ" of surface acoustic wave) is 15 percent.

Figure 9:
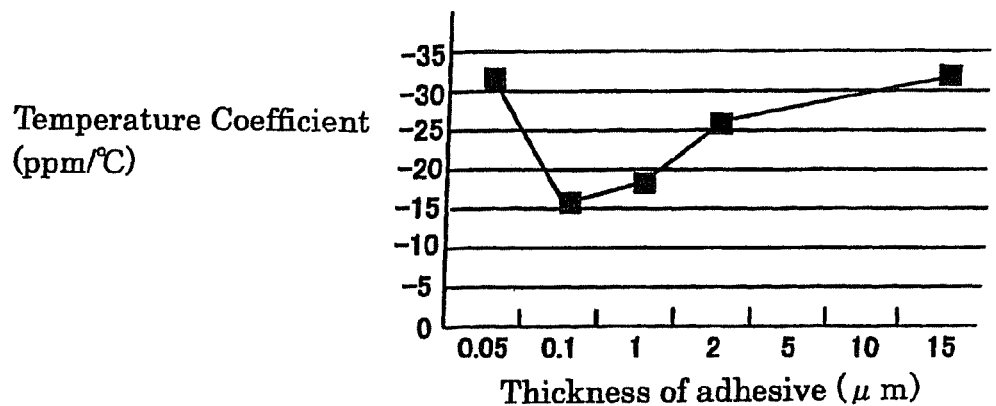
FIG. 9 is a graph showing the relationship of the thickness of an adhesive layer and the temperature characteristic of frequency.

The thickness "t" of the organic adhesive layer 2 was variously changed in a range of 0.05 to 15 μm. The temperature coefficient of frequency at the resonance point of the surface acoustic device was measured for each device and the results were shown in FIG. 9 and table 7.

TABLE 7

| | Thickness t of organic adhesive layer (μm) | | | |
| --- | --- | --- | --- | --- |
| | 0.05 | 0.1 | 1 | 15 |
| Temperature Coefficient of Frequency (ppm/° C.) | −32 | −16 | −18 | −32 |

Example 8

The surface acoustic wave device of FIG. 3 was made using the manufacturing method shown in FIG. 1.

It is noted that, as the propagation substrate 10 was used a 36° Y-cut, X-propagation lithium tantalate substrate which had been cut out at an angle determined so as to form the rotated Y-cut plate and in which the direction of SAW propagation was set at the direction of the X-axis. The supporting substrate 12 was made of silicon single crystal. The thickness "T1" of the supporting substrate 12 was 500 μm and the thickness of the propagation substrate 10 was 10 μm. The electrodes 16, 17 and 18 made of aluminum and having a thickness of 0.14 μm was then formed on the thus obtained propagation substrate 10. (Thickness "t" of electrode)/(wavelength "λ" of surface acoustic wave) is 7 percent.

Figure 10:
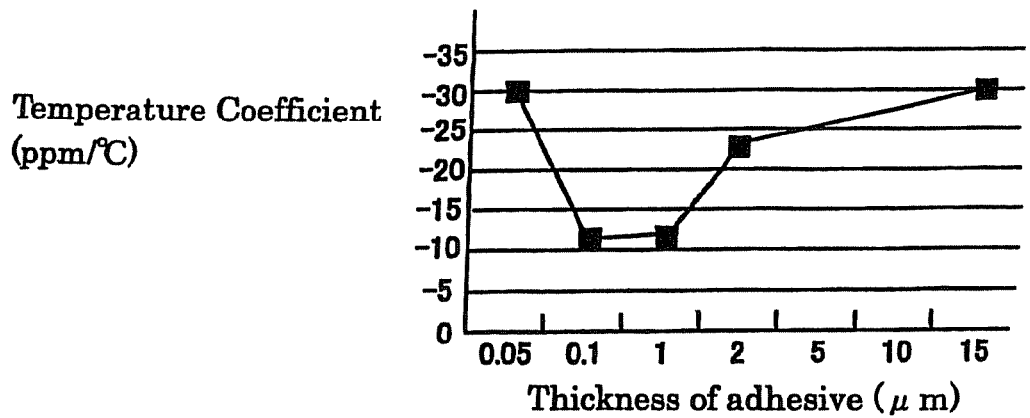
FIG. 10 is a graph showing the relationship of the thickness of an adhesive layer and the temperature characteristic of frequency.

The thickness "t" of the organic adhesive layer 2 was variously changed in a range of 0.05 to 15 μm. The temperature coefficient of frequency at the resonance point of the surface acoustic device was measured for each device and the results were shown in FIG. 10 and table 8.

TABLE 8

| | Thickness t of organic adhesive layer (μm) | | | |
| --- | --- | --- | --- | --- |
| | 0.05 | 0.1 | 1 | 15 |
| Temperature coefficient of Frequency (ppm/° C.) | −30 | −12 | −12 | −30 |

Example 9

The surface acoustic wave device of FIG. 3 was made using the manufacturing method shown in FIG. 1.

It is noted that, as the propagation substrate 10 was used a 36° Y-cut, X-propagation lithium tantalate substrate which had been cut out at an angle determined so as to form the rotated Y-cut plate and in which the direction of SAW propagation was set at the direction of the X-axis. The supporting substrate 12 was made of silicon single crystal. The thickness "T1" of the supporting substrate 12 was 150 μm and the thickness of the propagation substrate 10 was 25 μm. The electrodes 16, 17 and 18 made of aluminum and having a thickness of 0.14 μm was then formed on the thus obtained propagation substrate 10. (Thickness "t" of electrode)/(wavelength "λ" of surface acoustic wave) is 7 percent.

Figure 11:
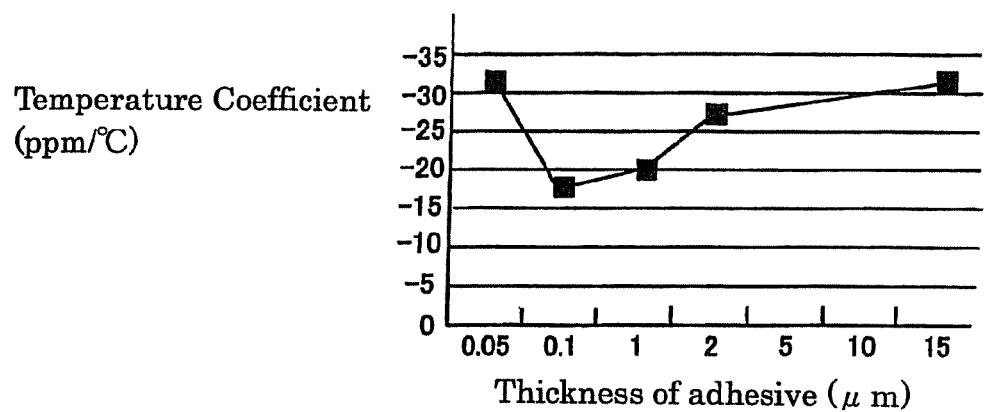
FIG. 11 is a graph showing the relationship of the thickness of an adhesive layer and the temperature characteristic of frequency.

The thickness "t" of the organic adhesive layer 2 was variously changed in a range of 0.05 to 15 μm. The temperature coefficient of frequency at the resonance point of the surface acoustic device was measured for each device and the results were shown in FIG. 11 and table 9.

TABLE 9

| | Thickness t of organic adhesive layer (μm) | | | |
|---|---|---|---|---|
| | 0.05 | 0.1 | 1 | 15 |
| Temperature Coefficient of Frequency (ppm/° C.) | −32 | −18 | −20 | −32 |

Example 10

The surface acoustic wave device of FIG. 3 was made using the manufacturing method shown in FIG. 1.

It is noted that, as the propagation substrate 10 was used a 36° Y-cut, X-propagation lithium tantalate substrate which had been cut out at an angle determined so as to form the rotated Y-cut plate and in which the direction of SAW propagation was set at the direction of the X-axis. The supporting substrate 12 was made of silicon single crystal. The thickness "T1" of the supporting substrate 12 was 300 μm and the thickness of the propagation substrate was 40 μm. The electrodes 16, 17 and 18 made of aluminum and having a thickness of 0.14 μm was then formed on the thus obtained propagation substrate 10. (Thickness "t" of electrode)/(wavelength "λ" of surface acoustic wave) is 7 percent.

Figure 12:
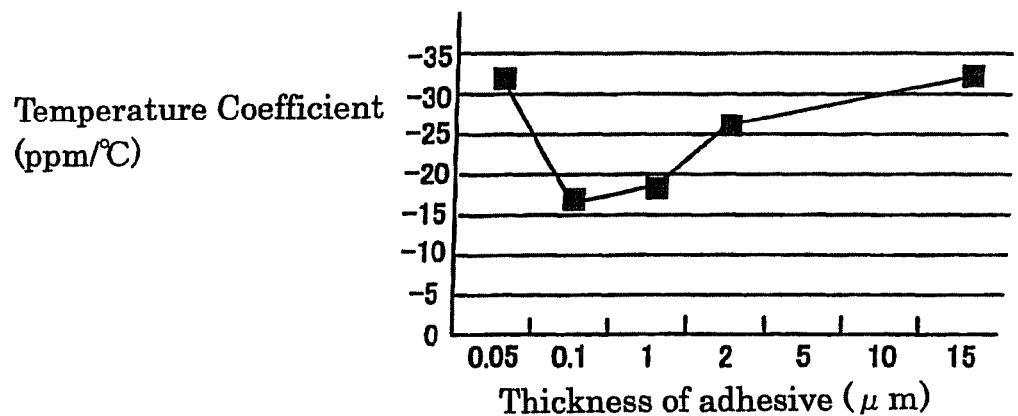
FIG. 12 is a graph showing the relationship of the thickness of an adhesive layer and the temperature characteristic of frequency.

The thickness "t" of the organic adhesive layer 2 was variously changed in a range of 0.05 to 15 μm. The temperature coefficient of frequency at the resonance point of the surface acoustic device was measured for each device and the results were shown in FIG. 12 and table 10.

TABLE 10

| | Thickness t of organic adhesive Layer (μm) | | | |
|---|---|---|---|---|
| | 0.05 | 0.1 | 1 | 15 |
| Temperature coefficient of Temperature (ppm/° C.) | −32 | −17 | −18 | −33 |

Example 11

The surface acoustic wave device of FIG. 3 was made using the manufacturing method shown in FIG. 1.

It is noted that, as the propagation substrate 10 was used a 36° Y-cut, X-propagation lithium tantalate substrate which had been cut out at an angle determined so as to form the rotated Y-cut plate and in which the direction of SAW propagation was set at the direction of the X-axis. The supporting substrate 12 was made of silicon single crystal or borosilicate glass. The thickness of the propagation substrate was 30 μm and the thickness of the adhesive layer was 0.3 μm. The electrodes 16, 17 and 18 made of aluminum and having a thickness of 0.14 μm was then formed on the thus obtained propagation substrate 10. (Thickness "t" of electrode)/(wavelength "λ" of surface acoustic wave) is 7 percent.

Figure 13:
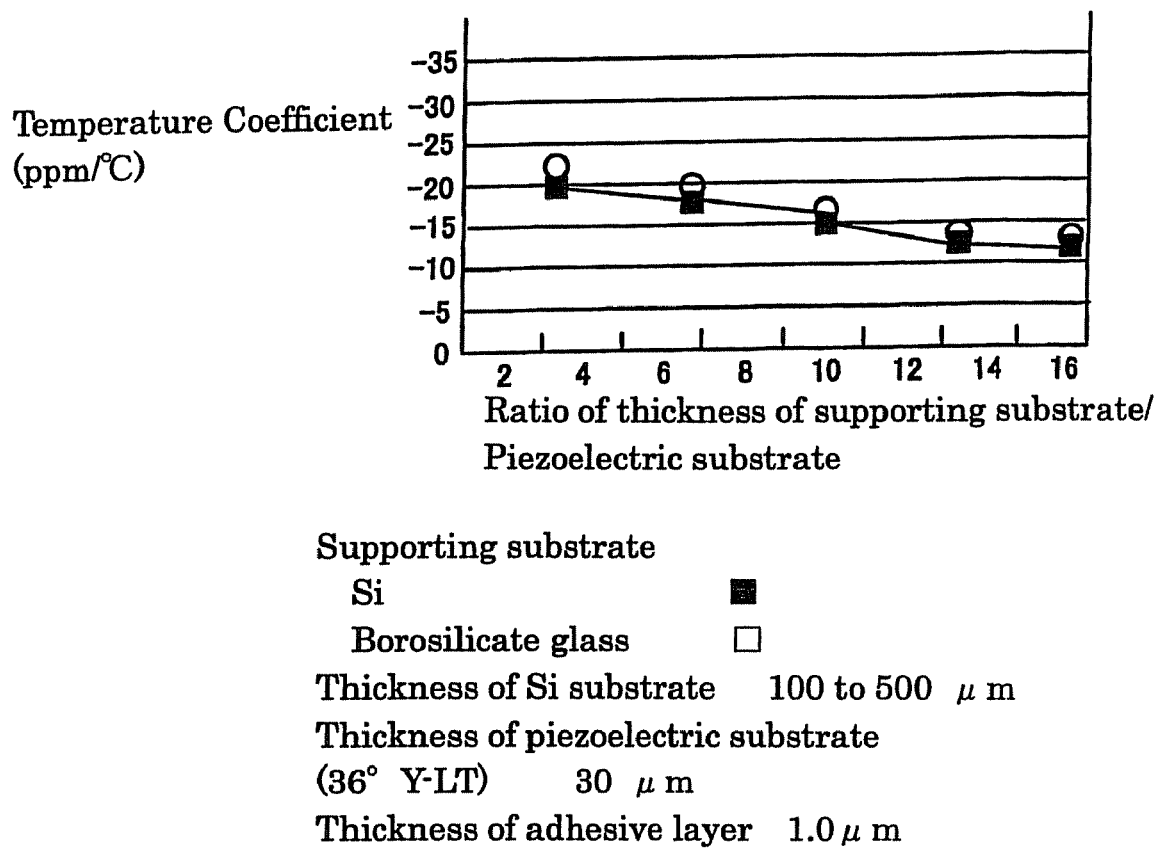
FIG. 13 is a graph showing the temperature characteristics of frequency when a supporting substrate is made of silicon or borosilicate glass and a ratio of the thickness of the supporting substrate and that of a piezoelectric substrate is varied.

The thickness "T1" of the supporting substrate 1 was variously changed in a range of 100 to 500 μm. The temperature coefficient of frequency at the resonance point of the surface acoustic device was measured for each device and the results were shown in FIG. 13 and table 11.

TABLE 11

| | Thickness of supporting substrate/ Thickness of piezoelectric substrate | | | | |
|---|---|---|---|---|---|
| | 3 | 7 | 10 | 13 | 16 |
| Temperature Coefficient of Frequency (ppm/° C.) Silicon | −20 | −18 | −15 | −13 | −12 |
| Temperature Coefficient of Frequency (ppm/° C.) Borosilicate glass | −22 | −20 | −18 | −14 | −13 |

As can be seen from the results, when the silicon substrate is used and the borosilicate glass substrate is used, the temperature coefficient of frequency was very low and substantially proportional with the ratio of the thickness of supporting substrate and that of the piezoelectric substrate, over a thickness of the supporting substrate of 100 to 500 μm.

Example 12

The surface acoustic wave device 6 of FIG. 2 was made according to the same procedure as the Example 1.

The following tests were performed under the same condition as the Example 1 except that the organic adhesive layer was made of epoxy resin adhesive. The thickness "t" of the organic adhesive layer 2 was variously changed in a range of 0.05 to 15 μm. The temperature coefficient of frequency at the resonance point of the surface acoustic device was measured for each device to obtain the similar results as the Example 1.

Example 13

The thickness of the organic adhesive was changed and its relationship with the adhesive strength (compressive shearing) of the 36° Y cut X propagation lithium tantalite substrate and the silicon substrate. The dimensions of the lithium tantalite substrate and the silicon substrate were 5×5×1 mm.

Thickness of organic adhesive: 0.02 μm
Adhesive strength: 25 kgf/cm$^2$
Thickness of organic adhesive: 0.05 μm
Adhesive strength: 40 kgf/cm$^2$
Thickness of organic adhesive: 0.1 μm
Adhesive strength: 100 kgf/cm$^2$
Thickness of organic adhesive: 0.2 μm
Adhesive strength: 200 kgf/cm$^2$ As can be seen form the above results, when the thickness of the organic adhesive layer is 0.1 μm or more, the target adhesive strength of 60 kgf/cm$^2$ or higher can be successfully attained. It is further preferred that the surface roughness of each adhesion surface of the lithium tantalite substrate and the silicon substrate may preferably be 0.1 m or less.

The invention claimed is:

1. A surface acoustic wave device comprising a surface acoustic wave filter or resonator, said device comprising:
    a supporting substrate;
    a propagation substrate comprising a piezoelectric single crystal;
    an organic adhesive layer having a thickness of 0.1 to 1.0 μm and bonding the supporting substrate and the propagation substrate; and
    an electrode provided on the propagation substrate.

2. The device of claim 1, wherein the piezoelectric single crystal is selected from the group consisting of lithium niobate, lithium tantalate and lithium niobate-lithium tantalate solid solution.

3. The device of claim 2, wherein the piezoelectric single crystal comprises lithium tantalate.

4. The device of claim 2, wherein a surface acoustic wave propagates in the propagation substrate in X direction and wherein the propagation substrate comprises 36 to 47° Y cut substrate.

5. The device of claim 4, wherein said electrode comprises aluminum or an aluminum alloy.

6. The device of claim 1, wherein a ratio "t/λ" of a thickness "t" of the electrode with respect to a wavelength "λ" of a surface acoustic wave is 3 to 15 percent.

7. The device of claim 1, wherein the propagation substrate has a thickness of 10 to 40 μm.

8. The device of claim 1, wherein the supporting substrate has a thickness of 150 to 500 μm.

9. The device of claim 1, wherein the supporting substrate comprises a material selected from the group consisting of silicon, sapphire, aluminum nitride, alumina, borosilicate glass and quartz glass.

10. The device of claim 9, wherein the supporting substrate comprises silicon or borosilicate glass.

11. The device of claim 10, wherein the supporting substrate comprises silicon.

12. The device of claim 1, wherein an oxide film is not formed on a surface of the supporting substrate.

13. The device of claim 3, wherein a surface acoustic wave propagates in the propagation substrate in X direction and wherein the propagation substrate comprises 36 to 47° Y cut substrate.

* * * * *